United States Patent
Aoyama

(10) Patent No.: US 6,697,145 B1
(45) Date of Patent: *Feb. 24, 2004

(54) SUBSTRATE PROCESSING APPARATUS FOR COATING PHOTORESIST ON A SUBSTRATE AND FORMING A PREDETERMINED PATTERN ON A SUBSTRATE BY EXPOSURE

(75) Inventor: Masaaki Aoyama, Kanagawa-ken (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/436,619

(22) Filed: May 8, 1995

(30) Foreign Application Priority Data

Sep. 12, 1994 (JP) .............................................. 6-217216

(51) Int. Cl.⁷ .......................... G03B 27/32; G03B 27/42
(52) U.S. Cl. ...................................................... 355/53
(58) Field of Search ..................... 355/53, 27; 414/935, 414/936, 937, 938, 939, 940, 941

(56) References Cited

U.S. PATENT DOCUMENTS

| 4,426,439 A | * | 1/1984 | Kobayashi et al. ......... 354/300 |
| 4,522,489 A | | 6/1985 | Bouwer .................... 355/53 X |
| 4,836,733 A | | 6/1989 | Hertel et al. ................ 414/225 |
| 4,900,939 A | | 2/1990 | Aoyama .................. 356/401 X |
| 4,917,556 A | * | 4/1990 | Stark et al. ................. 414/217 |
| 4,985,722 A | * | 1/1991 | Ushijima et al. ........... 354/319 |
| 5,061,144 A | * | 10/1991 | Akimoto et al. ............ 414/225 |
| 5,168,021 A | * | 12/1992 | Arai et al. ................ 355/53 X |
| 5,194,743 A | * | 3/1993 | Aoyama et al. ............ 250/548 |
| 5,202,716 A | * | 4/1993 | Tateyama et al. ........... 354/319 |
| 5,289,222 A | * | 2/1994 | Hurtig ........................ 354/317 |

FOREIGN PATENT DOCUMENTS

| JP | 61-137320 | 6/1986 |
| JP | 61-276220 | 12/1986 |
| JP | 04-085812 | 3/1992 |
| JP | 04-303913 | 10/1992 |

* cited by examiner

Primary Examiner—Fred L. Braun
(74) Attorney, Agent, or Firm—Westerman, Hattori, Daniels & Adrian, LLP

(57) ABSTRACT

A compact substrate processing apparatus which is designed so that the number of transfer shafts is reduced, and the time required to exchange wafers is reduced, and further a pre-alignment device provided in an aligner (exposure system) is simplified, or the need for such a pre-alignment device is eliminated, thereby enabling an improvement of the throughput in production of semiconductor or other micro devices. A wafer is taken out from a cassette by a transfer arm. The transfer arm is moved along a slider body to transfer the wafer to a photoresist coating unit. After coating of a photoresist, the wafer is subjected to positioning with regard to the center and the rotation angle in a positioning unit. With the pre-aligned conditions thereof maintained, the wafer is loaded onto a wafer holder of a projection aligner through the transfer arm. After exposure, the wafer holder is moved in the direction +X, and the wafer is unloaded by a transfer arm which belongs to a developer.

5 Claims, 4 Drawing Sheets

SUBSTRATE PROCESSING APPARATUS FOR COATING PHOTORESIST ON A SUBSTRATE AND FORMING A PREDETERMINED PATTERN ON A SUBSTRATE BY EXPOSURE

BACKGROUND OF THE INVENTION

1. Field of the Invention

The present invention relates to a substrate processing apparatus for forming a predetermined pattern (for micro devices, e.g. a semiconductor device, a liquid crystal device, a CCD, a thin-film magnetic head, a magneto-optic disc, etc.) on a thin substrate, e.g. a semiconductor wafer, a liquid crystal substrate, etc., by successively subjecting the substrate to patters forming processes, i.e. coating of a photosensitive material (photoresist), mask pattern exposure, and development.

2. Related Background Art

To produce a semiconductor device by lithography processes, a substrate processing system is used which consists essentially of a coater for coating a photoresist on a semiconductor wafer (hereinafter referred to simply as "wafer"), an aligner (exposure apparatus), e.g. a stepper, for exposing the photoresist to light according to the image of a pattern of a reticle (or a photomask or the like), and a developer for developing the photoresist on the wafer, as disclosed, for example, in U.S. Pat. No. 4,900,939.

It has recently been demanded to produce micro devices, particularly semiconductor devices, at a higher throughput (the number of products produced per unit time). Accordingly, there is a need to shorten the time required to transfer a wafer from a coater to an aligner and the time required to transfer a wafer from an aligner to a developer and to control the cycle time (the difference in processing time between the processing systems). Therefore, the conventional substrate processing apparatus has a wafer stocker disposed near or inside the aligner and further has a wafer loader system for delivering the wafer between the stocker and the aligner (or exposure system).

In the above-described conventional apparatus, wafers transferred from the coater are temporarily stored into the stocker through the wafer loader system, and when preparation for exposure has been completed, the wafers in the stocker are successively loaded into the aligner (or exposure system) through the wafer loader system. Upon completion of exposure, each wafer is delivered to the developer by using the wafer loader system again. The wafer loader system is composed of a plurality of transfer shafts which are arranged to intersect each other, and arms which move along these transfer shafts.

Wafers are generally formed with a cut portion (orientation flat, notch, etc.) for positioning with respect to the angle of rotation. In the aligner, the cut portion of a wafer must align with a predetermined direction. However, the rotation angle of a wafer delivered from the coater to the aligner is not fixed. Therefore, the conventional substrate processing apparatus is provided with a pre-alignment device for setting the wafer loaded into the aligner so that the cut portion of the wafer aligns with a predetermined direction.

Thus, the conventional substrate processing apparatus uses a special-purpose wafer loader system to load and unload wafers into and from the aligner, and further uses a special-purpose pre-alignment device to effect rough positioning of wafers. Accordingly, the time required to transfer a wafer from the coater to the aligner and the time required to transfer a wafer from the aligner to the developer cannot be made shorter than a predetermined time for the reasons stated below, and there therefore limits improvement of the throughput in the production of semiconductor devices:

① Since wafer loading and unloading operations are carried out by using arms on the same transfer shaft, the wafer loading and unloading positions in the aligner are the same. Consequently, the path for loading and the path for unloading overlap each other, resulting in each wafer passing along the useless overlap path. For this reason, the transfer time is lengthened.

② The wafer loader system has a plurality of transfer shafts, and every time a wafer shifts from one transfer shaft to another, the delivery of the wafer is carried out between arms. Accordingly, each individual wafer must be delivered an unfavorably large number of times throughout the apparatus.

③ Since a special-purpose pre-alignment device is used, the time for pre-alignment is added to the actual exposure time.

④ In the conventional substrate processing apparatus, the aligner is provided with a special-purpose wafer loader system and a special-purpose pre-alignment device. Therefore, the overall size of the aligner becomes large, thus making it difficult to construct the substrate processing apparatus in a compact form.

SUMMARY OF THE INVENTION

An object of the present invention is to provide a compact substrate processing apparatus which is designed so that the number of transfer shafts is reduced, and the time required to exchange wafers is reduced, and further a pre-alignment device provided in an aligner (exposure system) is simplified, or the need for such a pre-alignment device is eliminated, thereby enabling an improvement of the throughput in production of micro devices such as semiconductor devices.

Another object of the present invention is to provide a substrate processing apparatus which is designed so that loading of a substrate from a photosensitive material coating system into an exposure system and unloading of the substrate from the exposure system to a developing system can be carried out at the same side of the exposure system.

The present invention provides a substrate processing apparatus which has: a photosensitive material coating system (5) in which a photosensitive material is coated on a substrate (10) as an object of processing; an exposure system (21) which has a substrate stage (25 and 26) for positioning the substrate coated with the photosensitive material in the photosensitive material coating system, and in which the substrate is exposed to light according to the image of a mask pattern; and a developing system (36) in which development is carried out on the substrate that has been subjected to mask pattern exposure in the exposure system. The substrate processing apparatus includes: a pre-alignment device (17) for setting the rotation angle of the substrate, which has been coated with the photosensitive material in the photosensitive material coating system, to a predetermined angle; a first substrate transfer system (11 and 12) for transferring the substrate to the exposure system while maintaining the rotation angle set by the pre-alignment device; and a second substrate transfer system (37 and 38) for transferring the substrate to the developing system from a position in the exposure system which is different from a position to which the substrate is transferred from the photosensitive material coating system.

The substrate processing apparatus may be arranged such that the photosensitive material coating system (5E) and the developing system (36E) are disposed in parallel so that loading of the substrate from the photosensitive material coating system (5E) to the exposure system (21E) and unloading of the substrate from the exposure system (21E) to the developing system (36E) are carried out at the same side of the exposure system (21E).

According to the present invention, the photosensitive material coating system (5), the exposure system (21) and the developing system (36) are disposed in a row, so that the substrate coated with a photo sensitive material is loaded onto the substrate stage (25 and 26) in the exposure system (21) through the first substrate transfer system (11 and 12), and upon completion of exposure, the substrate stage (25 and 26) is moved to set the substrate to an unload position. Then, the substrate is transferred to the developing system (36) from the unload position through the second substrate transfer system (37 and 38). That is, the substrate stage (25 and 26) is also used as a part of the substrate transfer system, thereby reducing the number of transfer shafts, and thus shortening the substrate exchange time (delivery time).

Further, since the first substrate transfer system (11 and 12) transfers the substrate while maintaining the rotation angle set by the pre-alignment device (17), no pre-alignment device is needed in the exposure system (21). Accordingly, it is possible to reduce the overall installation area (foot print) of the exposure system (21), in which high-performance air conditioning is required.

If the photosensitive material coating system (3E) and the developing system (36E) are disposed in parallel to each other so tha t loading of the substrate from the photosensitive material coating system (5E) to the exposure system (21E) and unloading of the substrate from the exposure system (21E) to the developing system (36E) are carried out at the same side of the exposure system (21E), the substrate is transferred along a U-shaped path, including the path of transfer by the substrate stage (25 and 26).

Thus, in the present invention, loading of the substrate into the exposure system and unloading of the substrate from the exposure system are respectively carried out by the first substrate transfer system, which is provided in the photosensitive material coating system, and the second substrate transfer system, which is provided in the developing system, and the substrate stage, which is provided in the exposure system, is used as one of transfer shafts. Accordingly, the number of special-purpose transfer shafts required in the whole apparatus decreases, and the number of deliveries required for each substrate (wafer or the like) decreases, resulting in a reduction in the time required to transfer the substrate. Therefore, there is an improvement in the throughput of the process in which a substrate is coated with a photosensitive material and then subjected to exposure and development. At the same time, the overall size of the substrate processing apparatus can be reduced. In addition, since the number of deliveries required for each substrate can be reduced, generation of dust can be suppressed, and thus an improvement in reliability can be expected.

Further, since pre-alignment of the substrate is carried out in the photosensitive material coating system, no pre-alignment is needed in the exposure system, and it is only necessary to carry out exposure in the exposure system. Accordingly, the throughput further improves. In addition, since it is possible to minimize the area required for installation of the exposure system, in which high-performance air conditioning and vibration isolation are required, it is also possible to minimize the reinforcement required for the building construction such as enhancement of the floor strength and vibration isolation structure, which are particularly needed in the exposure system.

In layout at a factory, for example, if a plurality of substrate processing apparatuses are arranged in parallel by disposing a photosensitive material coating system, an exposure system and a developing system in a row for each substrate processing apparatus, processing systems in which the same processing is carried out, e.g., the photosensitive material coating systems, can be arranged on the same line. Thus, it is possible to simplify the piping for chemicals and pneumatic equipment, the wiring for signal cables, and the piping for air conditioning carried out for temperature and humidity control and dust removing.

When the exposure system in the substrate processing apparatus of the present invention is a step-and-scan projection aligner, the substrate stage is particularly suitable for use as one of transfer shafts because it serves to scan the substrate in a predetermined direction. Accordingly, the substrate transfer time can be further shortened.

Further, when the photosensitive material coating system and the developing system are disposed in parallel so that loading of the substrate from the photosensitive material coating system into the exposure system and unloading of the substrate from the exposure system to the developing system are carried out at the same side of the exposure system, the substrate processing apparatus, including the photosensitive material coating system, the exposure system and the developing system, can be arranged in a compact form.

DESCRIPTION OF THE PREFERRED EMBODIMENTS

A first embodiment of the substrate processing apparatus according to the present invention will be described below with reference to FIGS. 1 to 3. In this embodiment, the present invention is applied to a substrate processing system for producing a semiconductor device.

Figure 1:
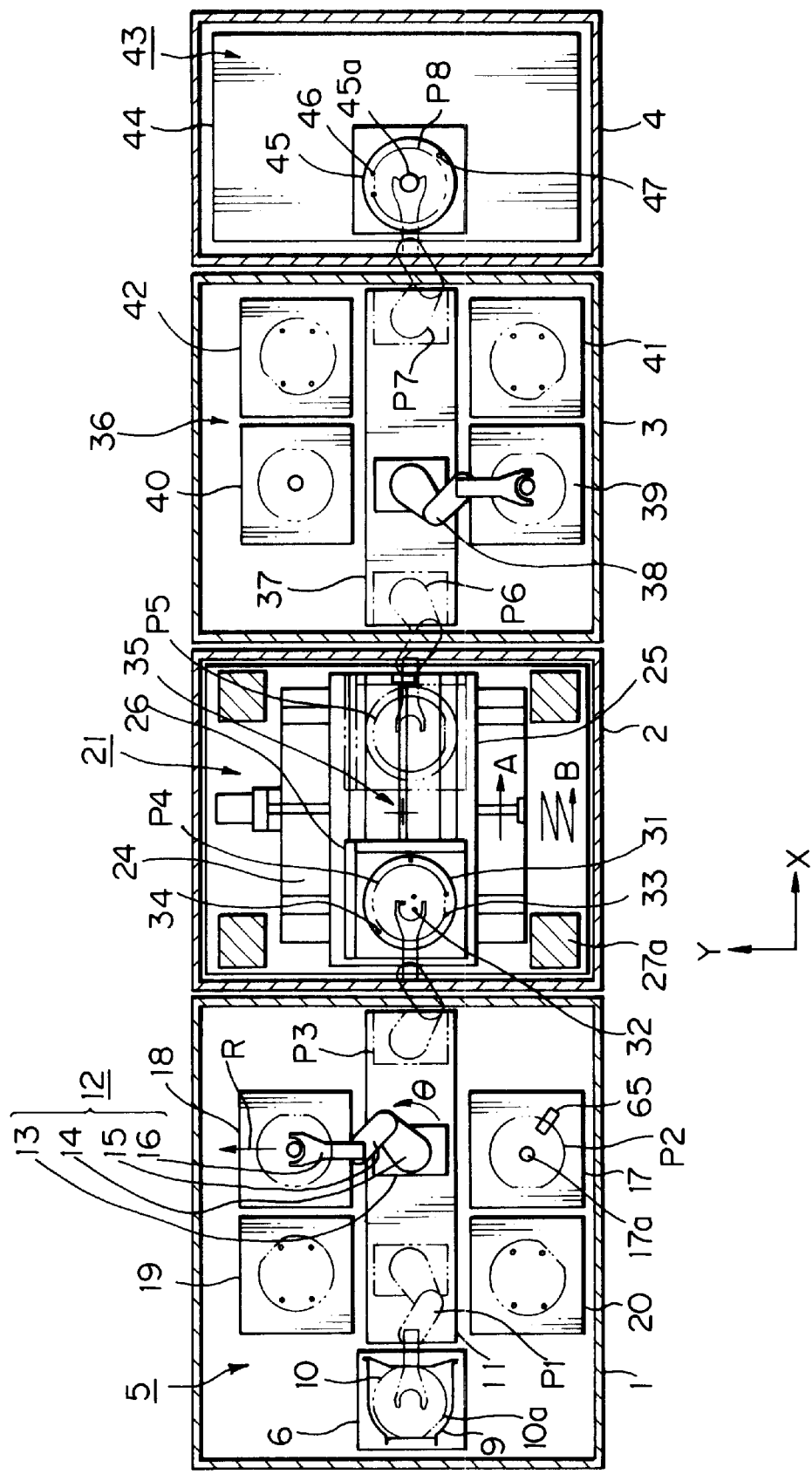
FIG. 1 is a plan view of a substrate processing system for producing a semiconductor device to which a first embodiment of the substrate processing apparatus according to the present invention is applied, in which chambers and a first column of a projection aligner are shown in sectional views.
Figure 2:
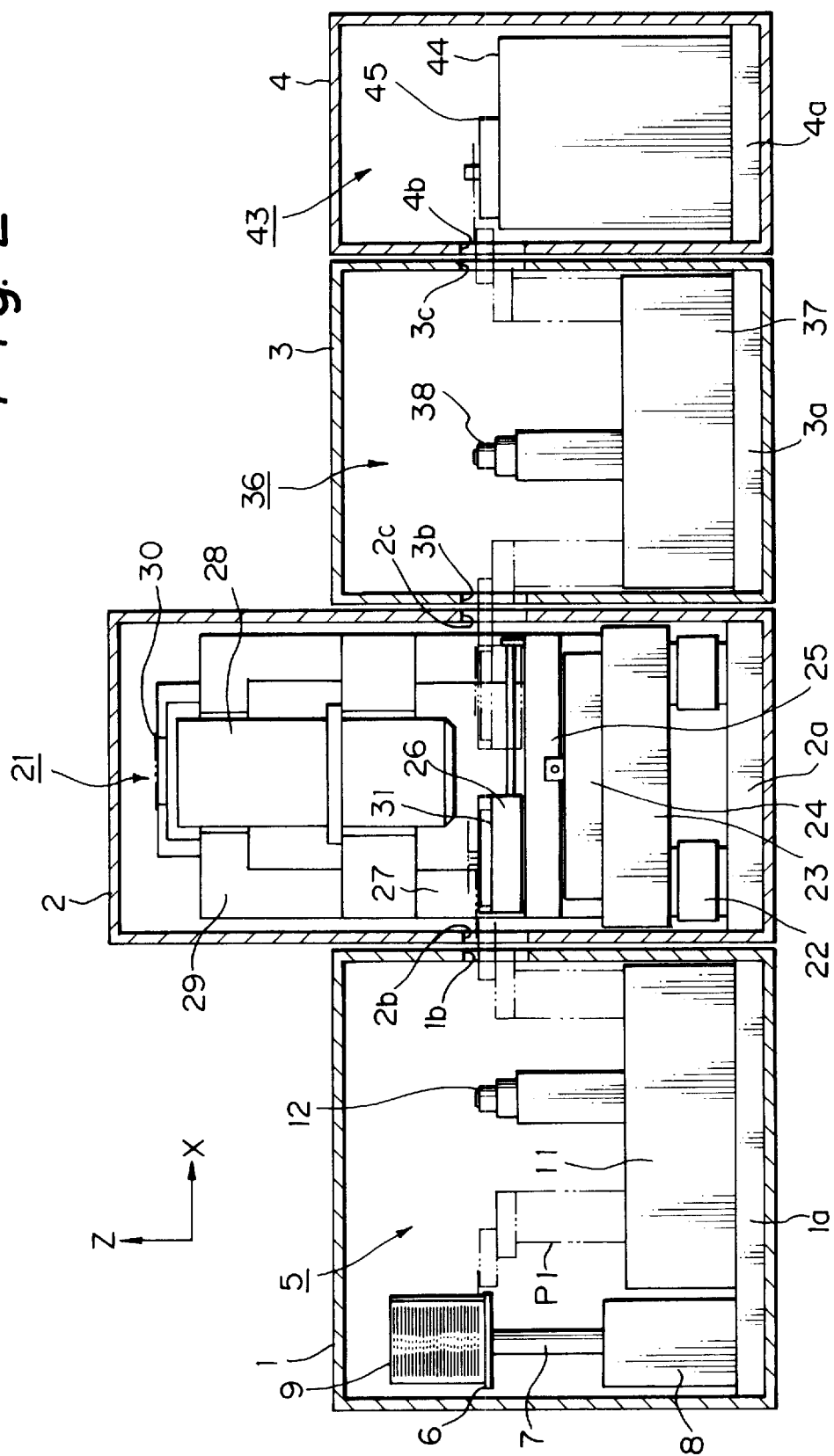
FIG. 2 is a front view of the substrate processing system according to the first embodiment, in which the chambers are shown in sectional views.

FIG. 1 is a plan view of a substrate processing system of this embodiment, in which four independent chambers 1 to 4, which are disposed in series, are shown in sectional views. FIG. 2 is a front view of the substrate processing system, in which the chambers 1 to 4 are shown in sectional views. In these figures, an X-axis is taken in the direction in which the chambers 1 to 4 are disposed in series. A Y-axis is taken in a direction which is parallel to the plane of FIG. 1 and perpendicular to the X-axis. A Z-axis is taken in a direction which is parallel to the plane of FIG. 2 and perpendicular to the X-axis. As shown in FIG. 2, a coater 5, a projection aligner 21, a developer 36, and an inspection machine 43 are installed in the chambers 1, 2, 3, and 4, respectively. An opening 1b is formed in the right-hand side wall of the chamber 1. Openings 2b and 2c are respectively formed in side walls at both sides of the chamber 2 along a straight line which passes through the opening 1b and extends parallel to the X-axis. Similarly, opening 3b and 3c are respectively formed in side walls at both sides of the chamber 3 along the above-described straight light. The chamber 4 has an opening 4b which is formed in the left-hand side wall thereof along the above-described straight line. Wafers which are being processed are transferred through the openings 1b to 4b.

the coater 5, which is installed in the chamber 1 as shown in FIG. 2, a driving device 8 is installed on the floor 1a of the chamber 1. A cassette table 6 is installed on the driving device 8 through a Z-axis slider 7 so that the cassette table 6 is movable in the direction Z. A predetermined number of cassettes 9 are mounted on the cassette table 6. Each cassette 9 accommodates a wafer. A slider body 11 is installed on the floor la in parallel to the X-axis so as to lie adjacent to the driving device 8. A transfer arm 12 is mounted on the slider body 11 so as to be movable in the X-axis.

As shown in FIG. 1, the transfer arm 12 is an articulated robot arm, which comprises a moving part 13 which moves in the direction X along the slider body 11, a θ-axis rotating part 14 which is provided on the moving part 13 so as to rotate about a predetermined axis on the moving part 13, an R-axis rotating part 15 which is rotatably provided on the distal end of the θ-axis rotating part 14, and a hand part 16 which is rotatably provided on the distal end of the R-axis rotating part 15. In addition, a vacuum holding part is attached to the distal end of the hand part 16. The hand part 16 rotates in the direction θ in response to rotation of the rotating part 14. The position in the radial direction (direction R) of the hand part 16 can be adjusted by combining the rotation angle of the R-axis rotating part 15 with the rotation angle of the hand part 16. The transfer arm 12 can transfer a wafer with the center and rotation angle of the wafer maintained in set conditions. The transfer arm 12 is disclosed in U.S. Pat. No. 4,836,733.

Further, a baking unit 19 and a photoresist coating unit 18 are installed at respective positions in the direction +Y as viewed from the slider body 11. In addition, a cooling unit (coolant) 20 and a positioning unit 17 (pre-alignment mechanism) are installed in parallel at respective positions in the direction −Y as viewed from the slider body 11. The transfer arm 12 is capable of passing a wafer between the same and each of the surrounding units, that is, the cassette 9, the positioning unit 17, the photoresist coating unit 18, the baking unit 19, and the cooling unit 20. The positioning unit 17 has a turntable 17a for rotating a wafer secured thereto by vacuum, and a geometrical sensor 65 which continuously detects the radial length of the wafer when rotated by the turntable 17a. The turntable 17a is provided with a rotary encoder for detecting an angle of rotation. The geometrical sensor 65 comprises a projector which projects a slit-shaped light beam onto the substrate being rotated, and a line sensor which generates a detection signal corresponding to the width of the light beam passing through the outer peripheral portion of the wafer.

With the wafer being rotated by the turntable 17a, the detection signal from the geometrical sensor 65 is monitored in association with the rotation angle of the turntable 17a, thereby enabling detection of the center position of the wafer and the angle of the cut portion thereof. It should be noted that the arrangement of the positioning unit 17 is not necessarily limited to that described above, and the positioning unit 17 may be arranged, for example, as disclosed in U.S. Pat. No. 5,194,743.

Next, in the projection aligner 21, which is provided in the chamber 2 as shown in FIG. 2, a vibration isolating bed 23 is installed on the floor 2a of the chamber 2 through a plurality of vibration isolating pads 22. A base 24, a Y-stage which moves in the direction Y, and an X-stage 26 which moves in the direction X are successively stacked on the vibration isolating bed 23. A wafer holder 31 is fixed on the X-stage 26, and a wafer as an object of exposure is held on the wafer holder 31 by vacuum. The Y-stage 25 and the X-stage 26 are driven by a motor MT. Further, a first column 27 is erected on the vibration isolating bed 23 by implanting. A projection optical system 28 is attached to the center of the upper part of the first column 27. A second column 29 is fixed on the first column 27, and a reticle stage (not shown) is disposed in the center of the upper part of the second column 29. A reticle 30, which is formed with an original pattern, is vacuum-held on the reticle stage. As shown in FIG. 1, the first column 27 has four legs 27a. In addition, an illumination optical system (not shown) is disposed above the reticle 30.

An illumination optical system which is suitable for use in the projection aligner 21 as shown in FIG. 2 is disclosed, for example, in U.S. Pat. Nos. 5,307,207 and 5,333,035, and is usually accommodated in the chamber 2, together with the projection optical system 28 and other associated members. In this embodiment, however, since the projection aligner 21 is not provided with a wafer loader system nor a pre-alignment device, the floor area of the chamber 2 is extremely small. Therefore, it may be difficult to accommodate the whole illumination optical system in the chamber 2. For this reason, a part of the chamber 2 is stacked on either the chamber 1, which accommodates the coater 5, or the chamber 3, which accommodates the developer 36, and the whole or part of the illumination optical system is accommodated in that part of the chamber 2. With this arrangement, it becomes unnecessary to increase the floor area required for the projection aligner 21. The arrangement may be such that the whole or part of the illumination optical system is accommodated in a chamber which is provided separately from the chamber 2, and this chamber is installed on the chamber 1 or 3.

The projection aligner 21 has a reticle library which retains a stack of reticle cassettes which accommodate reticles, and a reticle loader system which takes out a reticle from one of the reticle cassettes and transfers it to the reticle stage. In this embodiment, however, it may be difficult to accommodate the reticle library and the reticle loader system in the chamber 2 for the same reason as the above. Therefore, a part of the chamber 2 or another chamber is stacked on the chamber 1 or 3, and the reticle library and the reticle loader system are accommodated in that part of the chamber 2 or the additional chamber. That is, in this embodiment, the chamber 2 is arranged to extend over the chambers 1 and 3, or additional chambers are installed on the chambers 1 and 3, and the illumination optical system is accommodated in the chamber provided on one of the chambers 1 and 3, while the reticle library and the reticle loader system are accommodated in the chamber provided on the other of the chambers 1 and 3.

Further, the chamber 2, shown in FIG. 2, is arranged such that a temperature-controlled gas (air) is supplied into the chamber 2 through a HEPA filter (High-Efficiency Particulate Air-filter) and a chemical filter and returned to an air conditioner (including a temperature controller, a blower, etc.) through a return duct so that the temperature in the chamber 2 is maintained at a substantially constant level. The air conditioner is accommodated in a chamber which is provided separately from (side by side with) the chamber 2, and arranged such that the temperature-controlled gas circulates in the chamber 2 through a hose or the like. With this arrangement, the vibration of the blower or other device is prevented from being transmitted to the projection aligner 21. The chemical filter removes impurities (ionic substances such as ammonia group, sulfate group, nitrate group, etc., organic silane, and so forth) floating in a clean room in which the substrate processing system of this embodiment is installed. Examples of chemical filters usable in this embodiment are an activated carbon filter such as that disclosed in U.S. Pat. No. 5,166,530, a resin filter containing an ion exchange substance and activated carbon, a zeolite-containing filter, etc.

Referring to FIG. 1, three wafer delivery pins 32 are provided in the central portion of the wafer holder 31 so that the pins 32 can selectively project and withdraw from the surface of the wafer holder 31. With the pins 32 projected from the wafer holder 31, a wafer is delivered from the coater 5 and placed on the pins 32 by the transfer arm 12. Thereafter, the pins 32 are withdrawn into the wafer holder 31, thereby allowing the wafer to be mounted on the wafer holder 31. This wafer delivering mechanism is disclosed in U.S. Pat. No. 4,522,489. Further, three positioning pins 33 are provided on the wafer holder 31. However, the positioning pins 33 are not always needed because in this embodiment the wafer is placed on the wafer holder 31 in a state where it has already been pre-aligned, as described later. Further, an offset part 34 is provided on the wafer holder 31 for fine adjustment of the position of the wafer in a case where higher positioning accuracy is required at the time of pre-alignment of the wafer.

When exposure is to be carried out by a step-and-repeat projection process, the center of shot regions on the wafer are successively set at the exposure center 35. Thus, the wafer is moved along a path such as that shown by a locus B, for example. The projection aligner 21 may also use a step-and-scan projection process in which exposure is carried out by synchronously moving the reticle and each shot region on the wafer relative to the projection optical system. In the case of the step-and-scan projection process, shot regions on the wafer are scanned with respect to the exposure center 35 as shown by a locus A which is parallel to the X-axis, for example. The step-and-scan projection aligner is disclosed, for example, in U.S. Pat. No. 5,194,893.

Next, in the developer 36, which is provided in the chamber 3 as shown in FIG. 2, a slider body 37 is installed on the floor 3a of the chamber 3 in parallel to the X-axis, and a transfer arm 38 (articulated robot arm) is mounted on the slider body 37 so as to be movable in the direction X. The slider body 37 and the transfer arm 38 are arranged approximately in the same way as the slider body 11 and the transfer arm 12, respectively, which are provided in the coater 5. As shown in FIG. 1, a development processing unit 40 and a cooling unit (coolant) 42 are installed at respective positions in the direction +Y as viewed from the slider body 37. In addition, a development processing unit 39 and a baking unit 41 are installed at respective positions in the direction −Y as viewed from the slider body 37. The transfer arm 38 is capable of passing a wafer between the same and any of the surrounding units, that is, the development processing unit 40, the cooling unit 42, the development processing unit 39, and the baking unit 41.

In the inspection machine 43, which is provided in the chamber 4, an inspection machine body 44 is installed on the floor 4a (see FIG. 2) of the chamber 4, and a wafer holder 45 is fixed on the top of the inspection machine body 44. The wafer holder 45 is provided thereon with a turntable 45a, three positioning pins 46, and an offset part 47 for adjusting the wafer position. The inspection machine 43 inspects the wafer held on the wafer holder 45 for defects.

The following is a description of one example of a system operation taking place when a wafer is subjected to a series of processing operations in this embodiment. Referring to FIG. 2, the operator first opens an entrance window (not shown) which is provided in a side wall of the chamber 1, and places on the cassette table 6 a pre-determined number of cassettes 9, each accommodating a wafer as an object of exposure. Thereafter, the transfer arm 12 is moved along the slider body 11 and set at an end position P1 in the direction −X, and the Z-axis slider 7 is vertically moved so that the height of a cassette 9 accommodating a wafer which is to be subsequently subjected to exposure coincides with the height of the hand part 16 of the transfer arm 12. Then, as shown in FIG. 1, a wafer 10 having a cut portion 10a is taken out from the cassette 9 with the hand part 16 of the transfer arm 12, and the transfer arm 12 is moved along the slider body 11 as far as a position in front of the photoresist coating unit 18. Thereafter, the wafer 10 is transferred from the transfer arm 12 to the photoresist coating unit 18. Then, the wafer 10 coated with a photoresist is moved to a position P2 on the positioning unit 17 by the transfer arm 12. At the position P2, pre-alignment is effected such that the center of the wafer 10 and the rotational position of the cut portion 10a are set to predetermined conditions. Thereafter, the wafer 10 is taken out from the positioning unit 17 by the transfer arm 12 with the center and rotation angle of the wafer 10 maintained. Then, the transfer arm 12 is moved along the slider body 11 as far as an end position P3 in the direction +X. It should be noted that during the above-described process, the wafer 10 may be subjected to baking and cooling in the baking unit 19 and the cooling unit 20, respectively, according to need.

At this time, the X-stage 26 of the projection aligner 21, which is provided in the chamber 2, has been set in the direction −X by the operation of the motor MT, as shown in FIG. 1. Under these conditions, the wafer 10 is placed at a load position P4 on the wafer holder 31 of the projection aligner 21 by the transfer arm 12 through the openings in the respective side walls of the chambers 1 and 2. In a case where the demanded positioning accuracy is the ordinary level, no pre-alignment need to be carried out at the projection aligner 21 because the center of the wafer 10 and the rotational position of the cut portion 10a have already been set in the pre-aligned conditions at the positioning unit 17. At the projection aligner 21, each shot region on the wafer 10 is projection-exposed to a pattern image of the reticle 30. Thereafter, the X-stage 26 is moved to an end in the direction +X by the motor MT to set the wafer 10 at an unload position P5.

At this time, the transfer arm 38 of the developer 36, which is provided in the chamber 3, has already been moved along the slider body 37 as far as an end position P6 in the direction −X to stand by for delivery of the wafer 10. The transfer arm 38 takes out the wafer 10 from the unload position P5 in the chamber 2 through the openings in the respective side walls of the chambers 2 and 3. Thereafter, the transfer arm 38 moves along the slider body 37 to a position in front of the development processing unit 39, and transfers the wafer 10 to the development processing unit 39. Upon completion of developing process, the transfer arm 38 takes out the wafer 10 from the development processing unit 39, and moves along the slider body 37 as far as an end position P7 in the direction +X. It should be noted that during the above-described process, the wafer 10 may be subjected to baking and cooling in the baking unit 41 and the cooling unit 42, respectively, according to need. The development processing unit 40 is used when the development processing unit 39 is being used to process another wafer or subjected to maintenance.

Thereafter, the transfer arm 38 places the wafer 10 on the wafer holder 45 of the inspection machine 43 in the chamber 4 through the openings in the respective side walls of the chambers 3 and 4. Thus, the wafer 10 is inspected for defects by the inspection machine 43. After the inspection has been completed, an exit window (not shown) of the chamber 4 is opened to carry the wafer 10 out of the substrate processing system.

Thus, according to this embodiment, the coater 5, the projection aligner 21, the developer 36, and the inspection machine 43 are arranged in a row, and the wafer 10 is transferred by the transfer arm 12, which belongs to the coater 5, and the transfer arm 38, which belongs to the developer 36. Further, the X-stage 26 of the projection aligner 21 is used also as a transfer shaft. Accordingly, the transfer system is simplified, the number of delivery required for each wafer is reduced, and the wafer transfer time is shortened in comparison to the conventional substrate processing system which is provided with a special-purpose wafer loader system that belongs to the projection aligner. Thus, the throughput of the process sequence from the photoresist coating to the inspection is improved. Further, the substrate processing system including the processing systems, from the coater 5 to the inspection machine 43, is made compact. In addition, there is a reduction in the installation area (foot print) of the projection aligner 21, in which high-performance air conditioning and vibration isolation are required the most. Therefore, the overall cost of the substrate processing system is reduced.

Next, one example of layout usable when a plurality of substrate processing systems as shown in FIGS. 1 and 2 are installed in parallel in a semiconductor manufacturing factory (i.e. in a clean room) will be explained with reference to FIG. 3.

Figure 3:
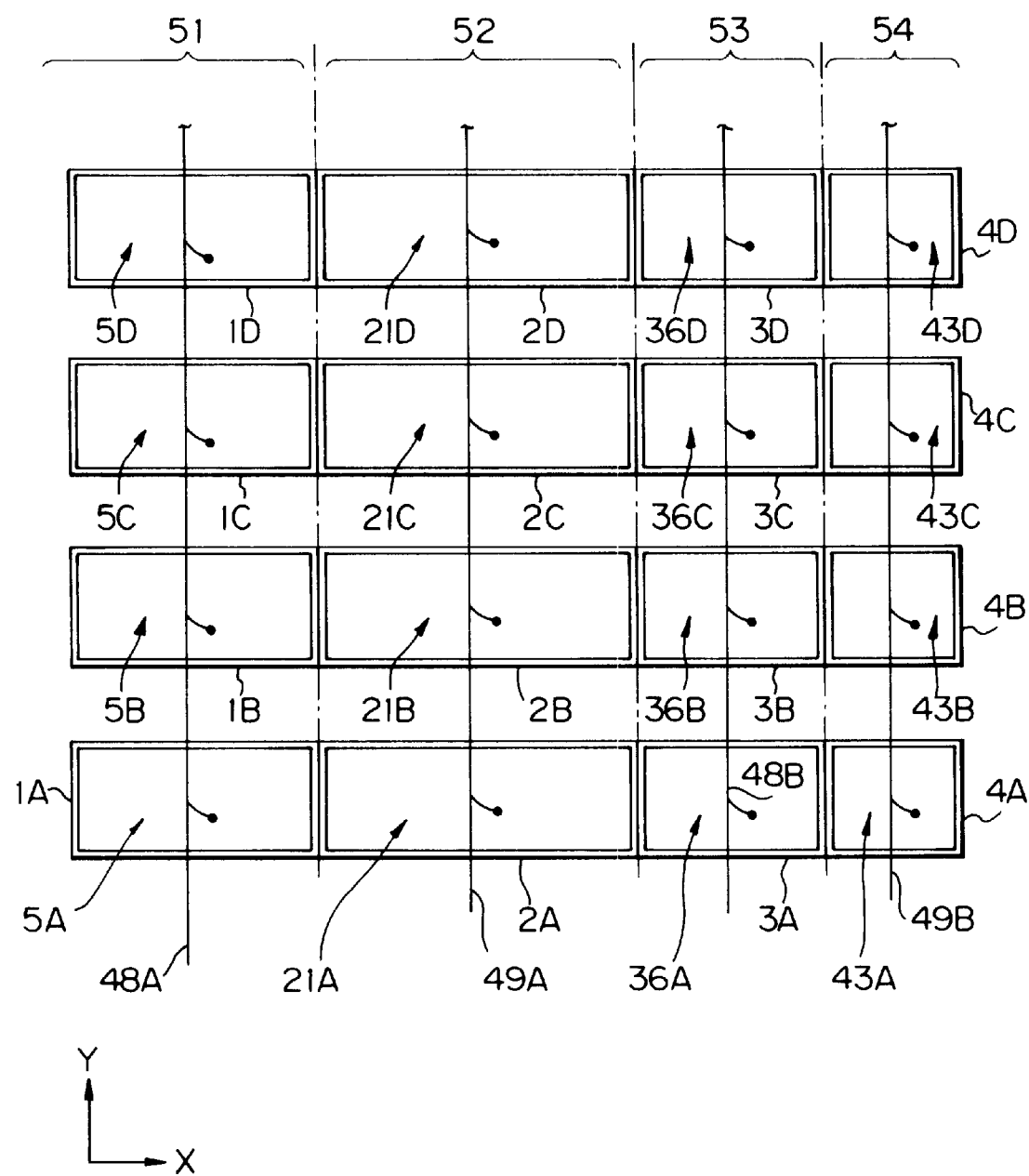
FIG. 3 is a plan view of one example of layout usable in a case where a plurality of substrate processing systems of the first embodiment are arranged in parallel in a factory.

In FIG. 3, chambers 1A to 4A of a first substrate processing system are disposed along the direction X. Chambers 1B to 4B of a second substrate processing system, chambers 1C to 4C of a third substrate processing system, and chambers 1D to 4D of a fourth substrate processing system are disposed in parallel to the first substrate processing system at predetermined regular intervals. Coaters 5A to 5D which are the same as the coater 5 shown in FIG. 1 are installed in the chambers 1A to 1D, respectively. Projection aligners 21A to 21D which are the same as the projection aligner 21 shown in FIG. 1 are installed in the chambers 2A to 2D, respectively. Developers 36A to 36D which are the same as the developer 36 shown in FIG. 1 are installed in the chambers 3A to 3D, respectively. Inspection machines 43A to 43D which are the same as the inspection machine 43 shown in FIG. 1 are installed in the chambers 4A to 4D, respectively.

Further, piping 48A for supplying various chemicals is installed above the coaters 5A to 5D. A communication cable 49A is installed above the projection aligners 21A to 21D. Piping 48B for supplying various chemicals is installed above the developers 36A to 36D. A communication cable 49B is installed above the inspection machines 43A to 43D. Further, a region 51 that surrounds the chambers 1A to 1D is an air-conditioning area for coaters. A region 52 that surrounds the chambers 2A to 2D is an air-conditioning and vibration isolating area for projection aligners. A region 53 that surrounds the chambers 3A to 3D is an air-conditioning area for developers. A region 54 that surrounds the chambers 4A to 4D is an air-conditioning area for inspection machines.

The projection aligners 21A to 21D each have a controller (minicomputer) which carries out general control for the whole exposure system. The communication cable 49A connects the controllers of the projection aligners 21A to 21D to a host computer, as disclosed, for example, in U.S. Pat. No. 5,243,377. The host computer exchanges various kinds of data concerning each projection aligner (e.g. the distortion characteristics of the projection optical system, exposure conditions, alignment data, etc.) with the plurality of projection aligners. By doing so, various patterns are accurately superimposed on one another on the wafer by the plurality of projection aligners, and thus it is possible to obtain a micro device, e.g. a semiconductor device, which meets the desired characteristics.

In this embodiment, since the installation area of the projection aligners 21A to 21D is minimized, it is possible to minimize the area of the region 52, in which high-performance air conditioning and vibration isolation are required. Therefore, the layout of the system in the factory is reduced in size as a whole. The layout of the pipings 48A and 48B and the communication cables 49A and 49B is also facilitated.

Figure 4:
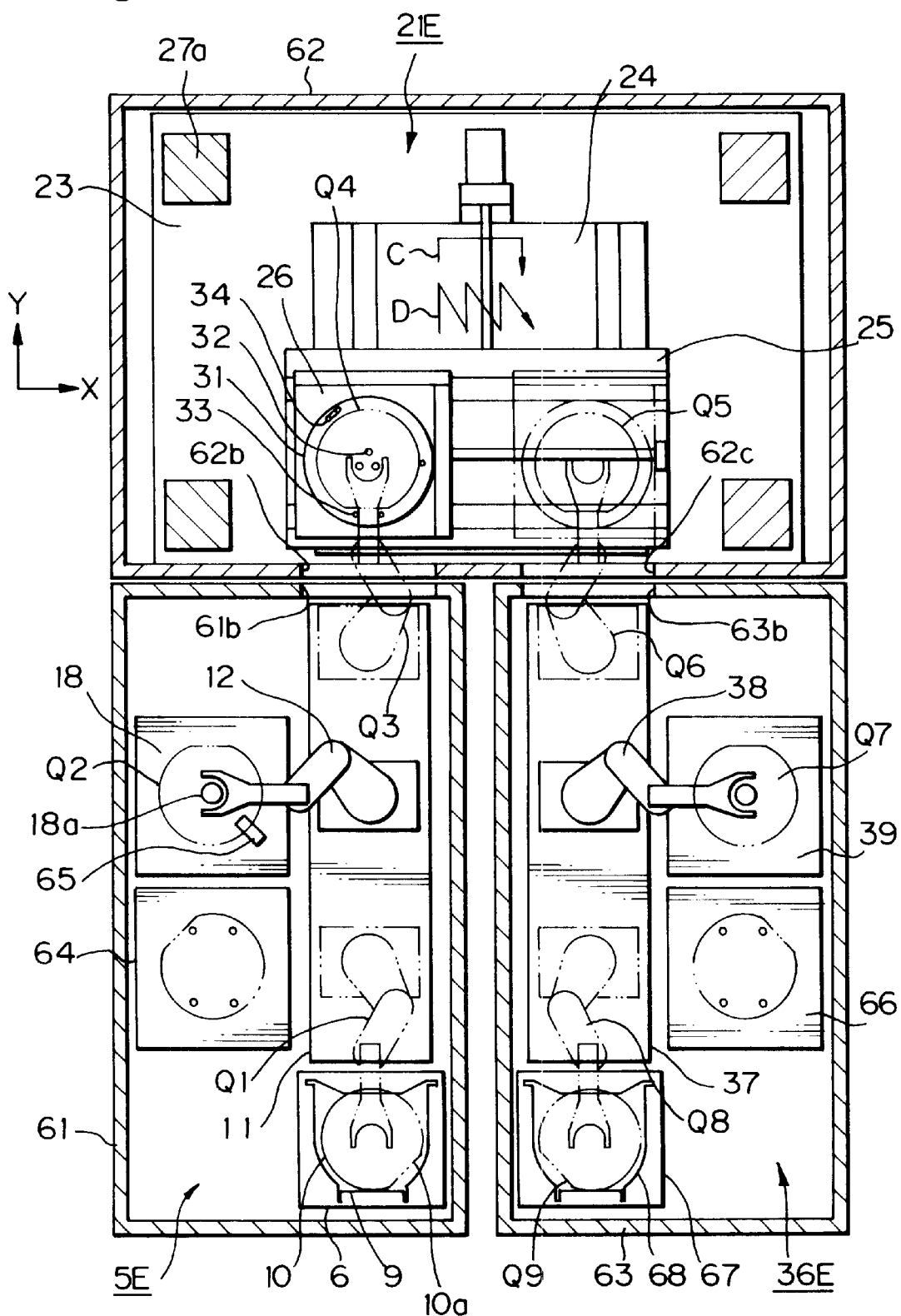
FIG. 4 is a plan view of a substrate processing system according to a second embodiment of the present invention, in which chambers and a first column of a projection aligner are shown in sectional views.

Next, a second embodiment of the present invention will be explained with reference to FIG. 4. In this embodiment, a coater, a projection aligner, and a developer are disposed in a U-shape. In FIG. 4, portions corresponding to those shown in FIGS. 1 and 2 are denoted by the same reference numerals, and detailed description thereof is omitted.

FIG. 4 is a plan view of the substrate processing system of this embodiment, in which chambers are shown in sectional views. In FIG. 4, a coater 5E, a projection aligner 21E, and a developer 36E are installed in chambers 61, 62 and 63, respectively, which are arranged in a U-shape. An opening 61b is formed in the side wall of the chamber 61 at the end thereof in the direction +Y. An opening 62b is formed in a side wall of the chamber 62 so as to face the opening 61b. Openings 62c and 63b are formed in the side walls of the chambers 62 and 63 at respective positions which are defined by shifting the openings 61b and 62b in the direction +X. A wafer being processed is transferred through the openings 61b to 63b.

In the coater 5E, which is provided in the chamber 61, a cassette table 6 is installed at the bottom right (as viewed in FIG. 4) of the chamber 61 so as to be movable in the direction Z (direction perpendicular to the plane of FIG. 4). A predetermined number of cassettes 9 are mounted on the cassette table 6. Each cassette 9 accommodates a wafer. A slider body 11 is installed above the cassette 9 in parallel to the Y-axis, and a transfer arm 12 is mounted on the slider body 11 so as to be movable in the direction Y.

A heat-treating unit 64 which carries out baking and cooling, and a photoresist coating unit 18 are installed at respective positions in the direction −X as viewed from the slider body 11. The photoresist coating unit 18 is provided with a turntable 18a and a geometrical sensor 65 which continuously detects the radial length of a wafer when rotated by the turntable 18a, thereby enabling the center position of the wafer and the angle of the cut portion to be detected in the photoresist coating unit 18.

Next, the arrangement of the projection aligner 21E in the chamber 62 is approximately the same as that of the projection aligner 21 shown in FIG. 1. However, the projection aligner 21E differs from the projection aligner 21 in that the position of the base 24 on the vibration isolating bed 23 is offset toward the side wall of the chamber 62 at the end thereof in the direction −Y. In this embodiment, with the Y-stage 25 moved on the base 24 to the end in the direction −Y by the motor MT, the X-stage 26 is moved on the Y-stage 25 as far as the end in the direction −X or +X, thereby allowing the wafer holder 31 on the X-stage 26 to lie near the opening 62b or 62c. During exposure, the wafer on the wafer holder 31 moves along a U-shaped path such as that shown by a locus C or along a path such as that shown by a locus D.

Next, in the developer 36E in the chamber 63, a slider body 37 is installed at an end in the chamber 63 in the direction −X so as to lie parallel to the Y-axis, and a transfer arm 38 is mounted on the slider body 37 so as to be movable in the direction Y. Further, a development processing unit 39 and a heat-treating unit 66 which carries out baking and cooling are installed at respective positions in the direction +X as viewed from the slider body 37. A cassette table 67 is installed at an end in the direction −Y of the slider body 37 so as to be movable in the direction Z, and a predetermined number of cassettes 68 are placed for accommodating wafers which have been subjected to developing process.

The following is a description of one example of a system operation taking place when a wafer is subjected to a series of processing operations in this embodiment. Referring to FIG. 4, the operator first opens an entrance window (not shown) of the chamber 61, and places on the cassette table 6 a predetermined number of cassettes 9, each accommodating a wafer as an object of exposure. Thereafter, the transfer arm 12 is moved along the slider body 11 and set at an end position Q1 in the direction −Y, and the cassette table 6 is vertically moved so that the height of a cassette 9 accommodating a wafer which is to be subsequently subjected to exposure coincides with the height of the hand part of the transfer arm 12. Then, a wafer 10 having a cut portion 10a is taken out from the cassette 9 by the transfer arm 12, and the transfer arm 12 is moved along the slider body 11 as far as a position in front of the photoresist coating unit 18. Thereafter, the wafer 10 is transferred from the transfer arm 12 to the photoresist coating unit 18. Then, the wafer 10 coated with a photoresist is subjected to pre-alignment by using the turntable 18a and the geometrical sensor 65 so that the center of the wafer 10 and the rotational position of the cut portion 10a are set to predetermined conditions.

Thereafter, the wafer 10 is taken out from the position Q2 on the photoresist coating unit 18 by the transfer arm 12 with the center and rotation angle of the wafer 10 maintained. Then, the transfer arm 12 is moved along the slider body 11 as far as an end position Q3 in the direction +Y. It should be noted that during the above-described process, the wafer 10 may be subjected to baking and cooling in the heat-treating unit 64 according to need.

At this time, the Y-stage 25 of the projection aligner 21E, which is provided in the chamber 62, has been set in the direction −Y by the operation of the motor MT, and the X-stage 26 has been set in the direction −X. Under these conditions, the wafer 10 is placed at a load position Q4 on the wafer holder 31 of the projection aligner 21E by the transfer arm 12 through the openings in the respective side walls of the chambers 61 and 62. In a case where the demanded positioning accuracy is the ordinary level, no pre-alignment need be carried out at the projection aligner 21E because the center of the wafer 10 and the rotational position of the cut portion 10a have already been set in the pre-aligned conditions at the photoresist coating unit 18. At the projection aligner 21E, each shot region on the wafer 10 is projection-exposed to a pattern image of the reticle. Thereafter, the X-stage 26 is moved to an end in the direction +X by the motor MT to set the wafer 10 at an unload position Q5.

At this time, the transfer arm 38 of the developer 36E, which is provided in the chamber 63, has already been moved along the slider body 37 as far as an end position Q6 in the direction +Y to stand by for delivery of the wafer 10. The transfer arm 38 takes out the wafer 10 from the unload position Q5 in the chamber 62 through the openings in the respective side walls of the chambers 62 and 63. Then, the transfer arm 38 moves along the slider body 37 as far as a position in front of the development processing unit 39, and transfers the wafer 10 to the development processing unit 39. After development has been completed, the transfer arm 38 takes out the wafer 10 from the development processing unit 39 and moves along the slider body 37 as far as an end position Q7 in the direction −Y. It should be noted that during the above-described process, the wafer 10 may be subjected to baking and cooling in the heat-treating unit 66 according to need.

Next, the transfer arm 38 puts the wafer 10, which has been subjected to development, in the cassette 68. Thereafter, an exit window (not shown) of the chamber 63 is opened to carry out the cassette 68 accommodating the wafer 10. Then, the cassette 68 is transferred to an inspection machine, for example.

Thus, according to this embodiment, the coater 5E, the projection aligner 21E, the developer 36E are arranged in a U-shape, and the wafer 10 is transferred by the transfer arm 12, which belongs to the coater 5E, and the transfer arm 38, which belongs to the developer 36E. Further, the X-stage 26 of the projection aligner 21E is used also as a transfer shaft. Accordingly, the transfer system is simplified, the number of delivery required for each wafer is reduced, and the wafer transfer time is shortened in comparison to the conventional substrate processing system which is provided with a special-purpose wafer loader system that belongs to the projection aligner. Thus, the throughput of the process sequence from the photoresist coating to the development is improved. Further, the substrate processing system including the processing systems, from the coater 5E to the developer 36E, is made compact. In addition, there is a reduction in the installation area (foot print) of the projection aligner 21E, in which high-performance air conditioning and vibration isolation are required the most. Therefore, the overall production cost of the substrate processing system is reduced.

Although in each of the foregoing embodiments the wafer load position and wafer unload position in the projection aligner are set at different positions, it should be noted that the load position and the unload position may be set at the same position. In this case also, loading of the wafer is carried out by the coater-side transfer arm 12, and unloading of the wafer is carried out by the developer-side transfer arm 38.

Further, the coater chamber (1 or 61), the projection aligner chamber (2 or 62) and the developer chamber (3 or 63) are provided with air-conditioning (temperature control) systems independently of each other. The air-conditioning systems are controlled, for example, such that the pressure in the projection aligner chamber is higher than the pressures in the coater and developer chambers so as to prevent air from flowing from the coater or developer chamber into the projection aligner chamber through the opening in the side wall thereof.

It should be noted that the present invention is not necessarily limited to the described embodiments, and that various changes and modifications may be imparted thereto without departing from the gist of the present invention, as a matter of course.

What is claimed is:

1. A substrate processing apparatus comprising:

a first chamber in which a coating system, a pre-alignment system and a transfer system are disposed, said coating system coating a photosensitive material on a substrate, said pre-alignment system detecting a center position and a rotating direction of said substrate, said transfer system transferring said substrate to said coating system and said pre-alignment system and from said coating system and said pre-alignment system, said first chamber having a first opening formed on a side wall thereof; and a second chamber which is disposed at a position adjacent to said first opening of the first chamber and in which a stage and an exposure system are disposed, said substrate coated with the photosensitive material being carried on said stage, said exposure system transferring a mask pattern on said substrate carried on said stage by exposure, said second chamber having a second opening, wherein said transfer system puts said substrate on said stage of said exposure system through said first opening and said second opening on the basis of information on said center position and said rotating direction of said substrate detected by said pre-alignment system, and wherein said stage is positioned at a predetermined receiving position in said second chamber when said transfer system puts the substrate on the stage.

2. A substrate processing apparatus according to claim 1, wherein said pre-alignment system comprises a turn table which rotates said substrate and a sensor which detects a length in the direction of a diameter of a wafer which is rotated by said turn table.

3. A substrate processing apparatus according to claim 2, further comprising a developing system which develops said substrate on which the mask pattern is transferred by exposure in said exposure system.

4. A substrate processing apparatus according to claim 3, further comprising a check system which checks existence of a defect on said substrate.

5. An exposure apparatus comprising:

an exposure apparatus main body which transfers a mask pattern onto a substrate by exposure, said exposure apparatus main body having a stage on which said substrate is carried; and a first chamber which has a first opening and in which said exposure apparatus main body is displaced, wherein said substrate is put on said stage by a transfer system which is displaced in a second chamber different from the first chamber through said first opening and a second opening which is formed on a side wall of the second chamber, wherein a coating system, a pre-alignment system and said transfer system are disposed in said second chamber, said coating system coating a photosensitive material on said substrate, said pre-alignment system detecting a center position and a rotating direction of said substrate, said transfer system putting said substrate on said stage on the basis of information on a center position and a rotating direction of said substrate detected by said pre-alignment system, and wherein said stage is positioned at a predetermined receiving position in said first chamber when said transfer system puts the substrate on the stage.

* * * * *